United States Patent
Roberts et al.

(10) Patent No.: US 10,515,173 B2
(45) Date of Patent: Dec. 24, 2019

(54) INPUT-OUTPUT PROCESSING ON A REMOTE INTEGRATED CIRCUIT CHIP

(71) Applicant: Advanced Micro Devices, Inc., Santa Clara, CA (US)

(72) Inventors: David A. Roberts, Wellesley, MA (US); Dean Gonzales, Fort Collins, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 69 days.

(21) Appl. No.: 15/859,156

(22) Filed: Dec. 29, 2017

(65) Prior Publication Data

US 2019/0205492 A1 Jul. 4, 2019

(51) Int. Cl.
| | |
|---|---|
| *G06F 17/50* | (2006.01) |
| *H01L 25/00* | (2006.01) |
| *G06F 9/38* | (2018.01) |
| *G06F 12/10* | (2016.01) |
| *H01L 25/065* | (2006.01) |
| *G06F 12/1081* | (2016.01) |
| *H01L 23/60* | (2006.01) |

(52) U.S. Cl.
CPC ........ *G06F 17/5068* (2013.01); *G06F 9/3881* (2013.01); *G06F 12/1081* (2013.01); *H01L 23/60* (2013.01); *H01L 25/0657* (2013.01)

(58) Field of Classification Search
CPC . H01L 25/0657; H01L 23/60; G06F 17/5068; G06F 17/5072; G06F 9/3881; G06F 12/1081; G06F 17/5069
USPC .............................. 716/110; 712/38; 710/22
See application file for complete search history.

(56) References Cited

U.S. PATENT DOCUMENTS

| | | | | |
|---|---|---|---|---|
| 7,913,202 | B2* | 3/2011 | Bernstein | G11C 29/006 716/104 |
| 8,975,919 | B1* | 3/2015 | Soebroto | H03K 19/1732 326/101 |
| 9,013,908 | B2* | 4/2015 | Chang | G11C 8/08 365/63 |
| 9,331,936 | B2* | 5/2016 | Ayoub | H04L 49/358 |
| 2009/0132751 | A1* | 5/2009 | Simmons | G06F 13/385 711/5 |
| 2011/0309468 | A1* | 12/2011 | Oh | H01L 24/94 257/508 |
| 2013/0145088 | A1* | 6/2013 | Frost | G06F 11/1008 711/103 |
| 2014/0050224 | A1* | 2/2014 | Kauschke | H04L 45/06 370/400 |
| 2014/0122560 | A1* | 5/2014 | Ramey | G06F 15/17312 709/201 |
| 2014/0304444 | A1* | 10/2014 | Walker | G06F 3/0631 710/260 |

(Continued)

*Primary Examiner* — Stacy Whitmore
(74) *Attorney, Agent, or Firm* — Park, Vaughan, Fleming & Dowler LLP (57) ABSTRACT

An electronic device includes a first integrated circuit chip including a processing functional block, and a second integrated circuit chip including an input-output (IO) functional block. The IO functional block performs one or more IO processing operations on behalf of the processing functional block in the first integrated circuit chip. The first integrated circuit chip lacks at least some elements of the IO functional block, so that the processing functional block is unable to perform corresponding IO operations without the IO functional block.

16 Claims, 4 Drawing Sheets

(56) References Cited

U.S. PATENT DOCUMENTS

2016/0165730 A1\* 6/2016 Fu ..................... H01L 25/0657
 361/748

\* cited by examiner

INPUT-OUTPUT PROCESSING ON A REMOTE INTEGRATED CIRCUIT CHIP

GOVERNMENT RIGHTS

This invention was made with Government support under the PathForward Project with Lawrence Livermore National Security (prime contract no. DE-AC52-07NA27344, subcontract no. B620717) awarded by DOE. The Government has certain rights in this invention.

BACKGROUND

Related Art

Some electronic devices include integrated circuit chips that interface with other integrated circuit chips and/or functional blocks. For example, a central processing unit (CPU) integrated circuit chip may interface with a network subsystem integrated circuit chip (e.g., a Wi-Fi integrated circuit chip, an Ethernet integrated circuit chip, etc.). In such electronic devices, each integrated circuit chip includes input-output (IO) interface circuit elements such as IO processors, queues/buffers, driver circuits, timing elements, etc. The IO interface circuit elements are responsible for receiving and handling IO communications received from the other integrated circuit chips and/or functional blocks as well as forwarding IO communications from the local integrated circuit chip to the other integrated circuit chips and/or functional blocks.

In certain cases, a silicon process that is used to manufacture an integrated circuit chip from a blank semiconductor wafer includes various features (e.g., transistor gates, metal routes, etc.) and circuit elements that are associated with physical effects that result in less than optimal operation of the above-described IO interface circuit elements. For example, driver transistors having smaller feature sizes may be susceptible to process, voltage, and temperature variation in the larger high-frequency transient currents that are necessary for communicating on some IO interfaces. In addition, passive components such as capacitors or inductors implemented in such silicon processes may suffer from performance issues. The less than optimal operation of the IO interface circuit elements means that data rates may be lower, more IO pins may be necessary, interconnect path lengths may be limited, and other accommodations may need to be made for the IO interface circuit elements.

In order to avoid the above-described issues with smaller feature sized IO interface circuit elements, some designers have proposed fabricating, on an integrated circuit chip on which the IO circuit elements are fabricated, the IO circuits in a silicon process with larger feature sizes. Such designs are complex to implement, as various silicon processing steps must be adjusted to incorporate the processing steps for the larger feature sizes and interacting circuits must be adapted to the larger feature sizes. In addition, layout area on many integrated circuit chips is severely constrained, meaning that each increase in area is expensive and difficult to implement—and can result in decreased yield.

BRIEF DESCRIPTION OF THE FIGURES

Throughout the figures and the description, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that the term may have significant additional aspects that are not recited herein for clarity and brevity and thus the description is not intended to limit the term.

Functional block: "functional block" as used herein refers to a group, collection, and/or set of one or more interrelated circuit elements such as integrated circuits, discrete circuit elements, etc. The circuit elements are "interrelated" in that circuit elements share at least one property. For instance, the interrelated circuit elements may be included in, fabricated on, or otherwise coupled to a particular integrated circuit chip or portion thereof, may be involved in the performance of given functions (computational functions, memory functions, etc.), may be controlled by a common control element, etc. For example, a functional block may include a set of circuit elements that perform media processing operations, such as a media processor in an electronic device. As another example, a functional block may include a processing pipeline, a compute unit, or dedicated processing circuits in a central processing unit (CPU) or graphics processing unit (GPU) in an electronic device. Note that, for the latter example, at least some circuit elements in the CPU or GPU—i.e., circuit elements outside the processing pipeline, etc.—are not included in the indicated functional block. A functional block can include any number of circuit elements, from a single circuit element (e.g., a single integrated circuit logic gate) to millions or billions of circuit elements (e.g., an integrated circuit memory), etc.

Overview

The described embodiments include an electronic device that includes a first integrated circuit chip and a second integrated circuit chip. For example, the first integrated circuit chip may be a processor chip that includes one or more processing functional blocks such as central processing unit (CPU) cores, graphics processing unit (GPU) cores, or application specific integrated circuits (ASICs), and the second integrated circuit chip may be a memory chip that includes memory circuits such as dynamic random access memory (DRAM) memory circuits. The second integrated circuit chip also includes an input-output (IO) functional block with various circuit elements for handling IO communications on one or more IO interfaces. In the described embodiments, the IO functional block in the second integrated circuit chip performs IO processing operations on behalf of the processing functional block in the first integrated circuit chip. For example, the IO functional block can receive, from a device external to the first and second integrated circuit chips, an IO communication destined for a processing functional block, perform IO processing operations on the IO communication (e.g., decoding, packet reassembly, demodulation, sequencing, data extraction, etc.), and forward information associated with the IO communication (e.g., data acquired from the IO communication, etc.) to the processing functional block. As another example, the IO functional block can receive, from the processing functional block, data to be included in an IO communication destined for an external device, perform IO processing operations to generate an IO communication prepared for transmission to the external device (e.g., encoding, data fragmentation, sequencing, and/or packetization etc.), and forward the IO communication to the external device via a corresponding IO interface.

In some embodiments, the processing functional block and, more broadly, the second integrated circuit chip, lacks at least some circuit elements that are found in the IO functional block. For example, the processing functional block may not include circuit elements such as IO processors, queues/buffers, driver circuits, timing elements, IO pins, etc. for performing operations for communicating on one or more IO interfaces. In these embodiments, the processing functional block may not be able to perform, or completely perform, corresponding IO processing operations without the IO functional block. For example, the processing functional block may be limited to producing raw/unprocessed or internal data such as intermediate layer packets (e.g., network or data link layer packets) in a network protocol stack that are to be incorporated into lower layer packets (e.g., data link or physical layer packets) or otherwise processed before being communicated to external devices. In these embodiments, therefore, the data communicated between the processing functional blocks and the IO functional block is not data that would ordinarily be communicated to external devices—i.e., is not a complete IO communication. Instead, the processing functional block delivers raw/unprocessed or partially processed data to the IO functional block and the IO functional block performs the herein-described IO processing operations on the data to generate a complete IO communication and otherwise ready the data to be transmitted to external devices.

In some embodiments, one or more signal routes that are used for communicating the data for IO communications (e.g., wires, guides, etc.) are coupled between the processing functional blocks on the first integrated circuit chip and the IO functional block on the second integrated circuit chip. For example, the signal routes may include one or more purpose-specific and/or dedicated signal routes such as a parallel or serial bus. As another example, the signal routes may include shared or general-purpose signal routes such as a bus that is also used for one or more other purposes (e.g., a memory bus). For embodiments in which shared signal routes are used, the IO functional block and/or the processing functional block include arbitration circuits for directing data and information from the shared signal routes to the appropriate circuit elements on the processing functional blocks and the IO functional block.

In some embodiments, the IO functional block includes one or more circuit elements that are configured to perform local processing on IO communications. For example, in some embodiments, the IO functional block is incorporated in a memory chip such as a DRAM chip, and the IO functional block includes a direct memory access (DMA) functional block that is configured to, as part of performing the IO processing operations on behalf of the processing functional block, identify IO communications that include data intended for storage in or retrieval from the memory (e.g., by monitoring for particular formats, addresses, etc. in the IO communications). In these embodiments, the DMA functional block can extract the data from the IO communications and store the data from the IO communications in the memory or retrieve data presently stored in the memory and return the retrieved data to a requesting device. Such local processing of the IO communications may replace corresponding processing operations involving the processing functional block. In other words, the data need not be forwarded to the processing functional block to be processed therein and returned to the memory chip for storage in the memory and/or data requests need not be forwarded to a processing functional block for handling therein.

In some embodiments, the processing functional block and the IO functional block, and possibly the respective integrated circuit chips, are fabricated using different silicon processes. The different silicon processes have different minimum feature sizes, e.g., for metal routes, gates, and other features. In these embodiments, the processing functional block has a smaller minimum feature size than the IO functional block, so that features in the IO functional block are generally larger than the same type of features in the processing functional block.

Because the IO functional block is located in the second integrated circuit chip, the described embodiments take advantage of the silicon process feature sizes (i.e., the larger feature sizes) in the second integrated circuit chip, which means that the circuit elements in the IO functional block have better performance than circuit elements in IO blocks in existing designs in which smaller feature sizes are used. In addition, the described embodiments avoid the need for providing area for the IO functional block on the first—or a separate and/or dedicated—integrated circuit chip and adjusting fabrication operations to fabricate the IO functional block in the larger feature sizes on the first integrated circuit chip. This improves the overall function of the integrated circuit chips and reduces the cost and effort of designing and fabricating the integrated circuit chips.

Electronic Device

Figure 1:
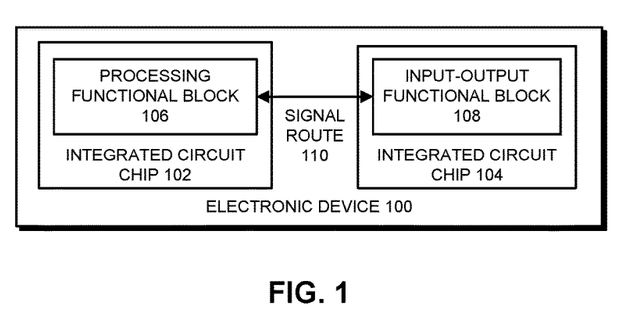
FIG. 1 presents a block diagram illustrating an electronic device in accordance with some embodiments.

FIG. 1 presents a block diagram illustrating an electronic device 100 in accordance with some embodiments. As can be seen in FIG. 1, electronic device 100 includes integrated circuit chips 102 and 104. Integrated circuit chips 102 and 104 perform corresponding operations in electronic device 100, e.g., computational operations, data storage/memory operations, input-output operations, network operations, media processing operations, and/or other operations. Integrated circuit chip 102 includes processing functional block 106 and integrated circuit chip 104 includes input-output (IO) functional block 108. Processing functional block 106 performs processing functions associated with or for the particular operations that are performed by integrated circuit chip 102. For example, in an embodiment where integrated circuit chip 102 is a central processing unit (CPU), processing functional block 106 performs general computational operations. As another example, in an embodiment where integrated circuit chip 102 is a graphics processing unit (GPU), processing functional block performs graphics processing operations and/or general computational operations (as in general-purpose GPU or GPGPU). As another example, in an embodiment where integrated circuit chip 102 is a media processor, processing functional block 106 performs media processing operations.

IO functional block 108 performs input-output processing operations on behalf of processing functional block 106. For example, in some embodiments, IO functional block 108 receives, from devices external to integrated circuit chips 102 and 104, IO communications (e.g., packets, protocol data units, messages, etc.) that are destined for processing functional block 106, performs IO processing operations to generate intermediate/internal data from or based on the IO communications, and then transmits the intermediate/internal data to processing functional block 106 for subsequent processing therein. As another example, in some embodiments, IO functional block 108 receives, from processing functional block 106, data in an intermediate/internal format, performs IO processing operations to generate, from the intermediate/internal data, IO communications that are prepared for transmission, and then transmits the IO communications to devices external to integrated circuit chips 102 and 104.

In some embodiments, communication paths that include one or more wires, guides, fibers, traces, and/or other communication channels are coupled between the functional blocks in electronic device 100, as shown by arrow-headed lines between the elements. The communication paths are used to transmit commands, data, and/or other information between the elements. For example, signal route 110 is coupled between processing functional block 106 and IO functional block 108. Using signal route 110, data and other information (e.g., control information, configuration information, etc.) can be transmitted between processing functional block 106 and IO functional block 108. For example, in some embodiments, signal routes 110 include a dedicated serial or parallel bus that is designated for carrying only data for IO communications between processing functional block 106 and IO functional block 108. As another example, in some embodiments, signal route 110 includes a serial or parallel bus that is used for carrying both data for IO communications and other data for integrated circuit chip 104 and/or integrated circuit chip 102 (e.g., memory data in embodiments where integrated circuit chip 104 is a memory chip, etc.), such as a Gen-Z, Hybrid Memory Cube (HMC), or Double Data Rate (DDR) bus.

Figure 2:
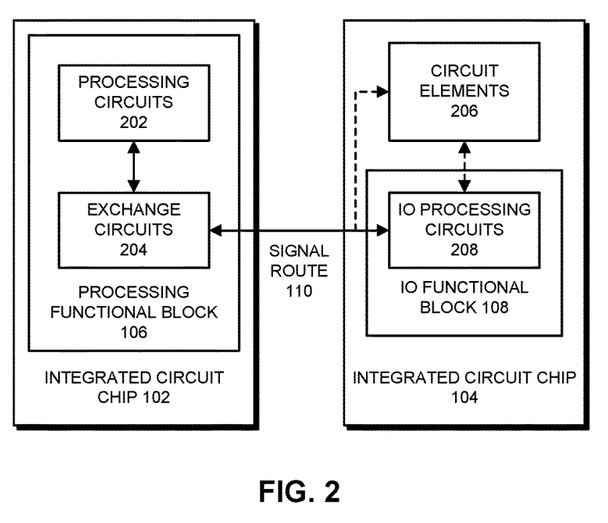
FIG. 2 presents a block diagram illustrating an expanded view of a processing functional block and an IO functional block in accordance with some embodiments.

FIG. 2 presents a block diagram illustrating an expanded view of processing functional block 106 and IO functional block 108 in accordance with some embodiments. As can be seen in FIG. 2, processing functional block 106 includes processing circuits 202 and exchange circuits 204, and IO functional block 108 includes IO processing circuits 208. Processing circuits 202 is a functional block that performs the operations associated with integrated circuit chip 102, such as general computational operations when integrated circuit chip 102 is a CPU, media processing operations when integrated circuit chip 102 is a media processor, etc.

Exchange circuits 204 is a functional block that includes circuit elements for forwarding data associated with IO communications between processing circuits 202 and IO processing circuits 208. The particular circuit elements that are included in exchange circuits 204 depend on the nature of the data associated with the IO communications. Exchange circuits 204 are generally, however, simpler or more basic circuit elements. For example, exchange circuits 204 may include only buffers, timing circuits, and/or transceivers for forwarding the data. As another example, and assuming an embodiment where signal route 110 is shared (i.e., also used for purposes other than transmitting data relating to IO communications), exchange circuits 204 may also include basic arbitration logic such as multiplexers, control logic, etc., that controls which type of data is presently being transmitted on signal route 110. Note, however, that exchange circuits 204, and, more generally, processing functional block 106 and integrated circuit chip 102, lacks circuit elements for performing some or all of the IO processing operations herein described as being performed by IO functional block 108.

IO processing circuits 208 include circuit elements that perform IO processing operations for data received from and destined for processing circuits 202. The particular circuit elements that are included in IO processing circuits 208 depends on the type of IO communications to be processed in IO processing circuits 208. For example, IO processing circuits 208 may include circuit elements for performing data link or physical layer processing of network or data link layer packets received from processing circuits 202 (via exchange circuits 204) and IO communications received from external devices, including reception/transmission, encoding/decoding, frame generation, flow control, error correction, equalization, modulation, line coding, and/or other operations.

Circuit elements 206 is a functional block that performs operations for integrated circuit chip 104. The particular operations performed by circuit elements 206, and thus the circuit elements that are present in circuit elements 206, depends on the nature of integrated circuit chip 104. For example, in some embodiments, integrated circuit chip 104 is a memory chip or an arrangement of memory chips, such as a DRAM chip or stack of DRAM chips, that is used to implement some or all of a main memory in electronic device 100 (i.e., a memory that stores instructions and data for use by processing functional block 106, etc.). As another example, in some embodiments, integrated circuit chip 104 is a media processing chip such as an audio-visual media processor that performs media processing operations such as encoding, decoding, rendering, generating streams, etc. for audio and/or visual information.

During operation, processing circuits 202 send, to exchange circuits 204, data in an internal or intermediate format. Exchange circuits 204 then forward the data, via signal route 110, to IO processing circuits 208 for the subsequent IO processing steps to prepare a corresponding IO communication that includes the data or information based on the data for transmission to the external device. For example, and assuming that the IO communication is made via a network with a network protocol stack that includes application, transport, network, data link, and physical layers, processing circuits 202 generate and send, via exchange circuits 204, to IO processing circuits 208, a network or data link layer packet. IO processing circuits 208 then process the received network or data link layer packet to generate a bit stream or other signal arrangement in the physical layer and transmit the bit stream or other signal arrangement (i.e., the IO communication) to the external device. In other words, IO processing circuits 208 perform, as IO processing operations, operations associated with the lower layer(s) of the network protocol stack to generate a physical layer arrangement of data to be transferred via the physical elements of a corresponding network to a destination external device. In addition, IO processing circuits 208 receive, at the physical layer, an IO communication formatted in accordance with the network protocol and process the IO communication through the physical layer and possibly the data link layer to generate data in an intermediate form—i.e., data prepared for processing at the data link layer or the network layer. IO processing circuits 208 then forward the data, via exchange circuits 204, to processing circuits 202 for subsequent processing therein, such as for processing by an operating system, driver, and/or receiving software application executed by processing circuits 202.

Recall that processing functional block 106, i.e., processing circuits 202 and exchange circuits 204, and integrated circuit chip 102 lack at least some of the circuit elements for performing some or all of the IO processing operations that are performed by IO processing circuits 208. Continuing the example from the preceding paragraph, this means that, in some embodiments, processing functional block 106 and integrated circuit chip 102 do not include circuit elements for performing some or all operations of a data link layer and/or a physical layer of a network stack for the IO communications. In other words, processing functional block 106 and integrated circuit chip 102 may not be able to perform some or all of reception/transmission, encoding/decoding, frame generation, flow control, error correction, equalization, modulation, line coding, and/or other operations for the IO communications. In these embodiments, processing functional block 106 relies on IO processing circuits 208, and, more generally, IO functional block 108, to perform these operations.

In some embodiments, signal route 110 is shared, multiplexed, or otherwise used for communicating both IO communications and one or more other types of communication. For example, signal route 110 may be a parallel or serial memory bus that is used for communicating data from a memory functional block (such as a DRAM memory) in integrated circuit chip 104, as well as being used for communicating the IO communications. The optional sharing of signal routes 110 is illustrated in FIG. 2 using dashed lines from signal route 110 to circuit elements 206. For example, circuit elements 206 in integrated circuit chip 104 may be a memory functional block that includes a set of memory circuits that function as some or all of a main memory in electronic device 100. In these embodiments, processing circuits 202 may communicate memory access requests (e.g., reads, writes, invalidations, etc.) via exchange circuits 204 (which, recall, can arbitrate access to signal route 110) to circuit elements 206, where the access requests are handled. Circuit elements 206 then return data, if necessary, in response to the access request via signal route 110 and exchange circuits 204 to processing circuits 202. Note that, in some embodiments, IO functional block 108 is not involved in at least some of the communications on signal route 110, so that circuit elements 206 communicate directly on signal route 110.

In some embodiments, circuit elements 206 communicate with IO processing circuits 208, as shown by the dashed line in FIG. 2. For example, in embodiments where integrated circuit chip 104 is a memory chip and circuit elements 206 includes memory circuits, IO processing circuits 208 can include a direct memory access (DMA) functional block that is configured to directly store, in the memory circuits, data received by IO processing circuits 208 from an external device. In other words, IO processing circuits 208 can include circuit elements that recognize when received IO communications include data that is to be stored in the memory and directly store the data into the memory. In these embodiments, the direct storage of the data can be used to avoid sending the data to processing circuits 202 for processing therein and return to circuit elements 206 for storage in the memory circuits—thereby reducing a processing load on processing circuits 202.

Although certain functional blocks, components, and elements are shown in electronic device 100, integrated circuit chip 102, and integrated circuit chip 104, in some embodiments, different functional blocks, components, and/or elements are included in electronic device 100, integrated circuit chip 102, and integrated circuit chip 104. For example, electronic device 100 may include one or more additional integrated circuit chips. In addition, although electronic device 100 is simplified for illustrative purposes, in some embodiments, electronic device 100 includes additional or different subsystems, functional blocks, circuit elements, and/or communication paths. For example, electronic device 100 may include power subsystems, display subsystems, networking subsystems, etc. Generally, electronic device 100 includes sufficient subsystems, functional blocks, circuit elements, and/or communication paths to perform the operations herein described.

Although not shown in FIGS. 1-2, in some embodiments, electronic device 100 includes, is coupled to, or is otherwise in communication with external devices such as remote electronic devices, sensors, IO cards, interface devices, peripheral devices, network devices, etc. from which IO communications are received and to which IO communications are sent. In these embodiments, the "external" devices may be physically external to electronic device 100, such as being a separate device that is coupled to electronic device 100 via a wired and/or wireless network, plug/cord, etc. In some embodiments, the "external" devices are other integrated circuit chips, functional blocks, and/or circuit elements in electronic device 100—which are "external" to the integrated circuit chips shown in FIGS. 1-2.

Electronic device 100 can be, or can be included in, any device that performs computational operations. For example, electronic device 100 can be, or can be included in, a desktop computer, a laptop computer, a wearable computing device, a tablet computer, a piece of virtual or augmented reality equipment, a smart phone, an artificial intelligence (AI) device, a server, a network appliance, a toy, a piece of audio-visual equipment, a home appliance, a vehicle, etc., and/or combinations thereof.

System Configurations

Figure 3:
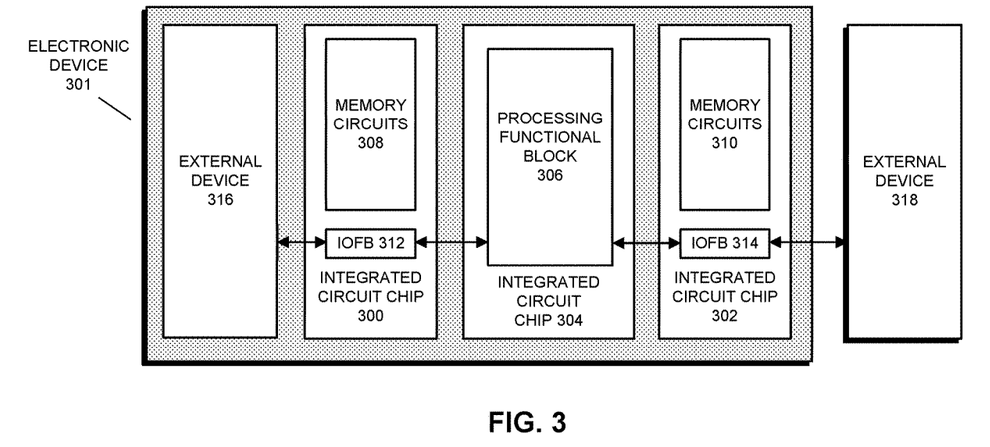
FIG. 3 presents a block diagram illustrating an arrangement of integrated circuit chips in an electronic device in accordance with some embodiments.

As described herein, electronic device 100 can include various arrangements of integrated circuit chips and functional blocks for performing the operations herein described. FIG. 3 presents a block diagram illustrating an arrangement of integrated circuit chips in electronic device 301 in accordance with some embodiments. Note that the integrated circuit chips and elements shown in FIG. 3 are presented as a general example of some embodiments. The integrated circuit chips and elements in other embodiments include different integrated circuit chips or elements and/or are arranged differently. Additionally, although certain mechanisms are used in describing operations performed by integrated circuit chips and elements in FIG. 3, in some embodiments, other mechanisms can perform the operations.

In the embodiment shown in FIG. 3, in electronic device 301, two memory integrated circuit chips 300-302 are coupled to integrated circuit chip 304 and to external devices 316-318. For the embodiment shown in FIG. 3, integrated circuit chip 304 is assumed to be a processor, and processing functional block 306 therefore includes various general-purpose processing circuit elements (CPU and/or GPU cores, etc.)—which may have similar internal elements to processing functional block 106 in FIG. 1. Integrated circuit chips 302-304 include memory circuits 308-310, respectively, which are or include, for example, DRAM memory circuits and/or other types of memory circuits. In some embodiments, integrated circuit chips 302 and/or 304 are stacked memory chips in which two or more individual/separate memory chips (or "dies") are stacked atop one another with control logic and memory interface circuit elements included on a separate logic integrated circuit chip in the stack and/or incorporated in some or all of the memory chips.

IO functional blocks ("IOFB") 312-314 are included in integrated circuit chips 300-302, respectively. As described herein, IO functional blocks 312-314 perform one or more IO processing operations on behalf of processing functional block 306. The particular IO processing operations depend on the nature of external devices 316-318. For example, in some embodiments, IO functional blocks 312-314 include circuit elements for lower layers of a network protocol stack, such as data link layers or physical layers. In these embodiments, the circuit elements include transmission line drivers, receiver circuits, timing circuits, processing circuits, buffers/queues, encoders/decoders, IO pins, and/or other circuit elements associated with the layer(s) of the network protocol stack.

External devices 316-318 are electronic devices such as peripheral devices, other integrated circuit chips, and/or other functional blocks that are coupled, along with the corresponding IO functional block 312-314, to a PCIe, Gen-Z, Inter-Integrated Circuit ($I^2C$) bus, Universal Serial Bus (USB), IEEE 1394 bus, Ethernet, IEEE 802.11, or other IO interface/network. For example, in some embodiments, one or both of external devices 316-318 are peripheral devices such as IO cards that are coupled to a PCIe bus in electronic device 301. In some embodiments, one or both of external devices 316-318 are "external" to electronic device 301 in that the external device(s) is/are physically outside a package, housing, and/or container of electronic device 301, such as being coupled to electronic device 301 via a wired or wireless network, a plug/wire, etc.

Figure 4:
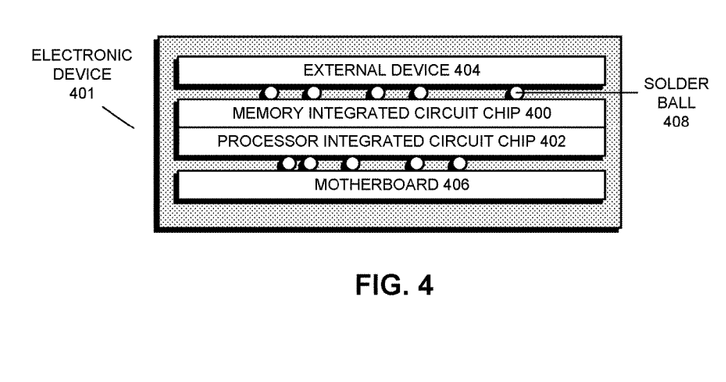
FIG. 4 presents a block diagram illustrating an arrangement of integrated circuit chips in an electronic device in accordance with some embodiments.

FIG. 4 presents a block diagram illustrating an arrangement of integrated circuit chips in electronic device 401 in accordance with some embodiments. Note that the integrated circuit chips and elements shown in FIG. 4 are presented as a general example of some embodiments. The integrated circuit chips and elements in other embodiments include different integrated circuit chips or elements and/or are arranged differently. Additionally, although certain mechanisms are used in describing operations performed by integrated circuit chips and elements in FIG. 4, in some embodiments, other mechanisms can perform the operations.

In the embodiment shown in FIG. 4, in electronic device 401, a memory integrated circuit chip 400 and a processor integrated circuit chip 402 are arranged in a stack, with memory integrated circuit chip 400 atop the processor integrated circuit chip 402. The stacked memory integrated circuit chip 400 and a processor integrated circuit chip 402 are coupled, via solder balls 408 (only one of which is labeled for clarity), to motherboard 406 and external device 404. The integrated circuit chips in FIG. 4, although it is not shown, may include arrangements of functional blocks and circuit elements similar to that shown in FIGS. 1-2. For example, processor integrated circuit chip 402 may include functional blocks such as processing circuits 202 and exchange circuits 204, while memory integrated circuit chip 400 includes functional blocks such as circuit elements 206 and IO processing circuits 208.

In some embodiments, memory integrated circuit chip 400 and processor integrated circuit chip 402 are coupled to one another via through silicon vias (TSVs), which are signal routes (e.g., metal traces, contacts, etc.) that are fabricated within a substrate of the corresponding integrated circuit chip. In some embodiments, the TSVs may couple a given integrated circuit chip, such as memory integrated circuit chip 400, directly to a device on the other side of an intermediate integrated circuit chip. For example, memory integrated circuit chip 400 may be coupled, via TSVs passing through processor integrated circuit chip 402, to motherboard 406.

Figure 5:
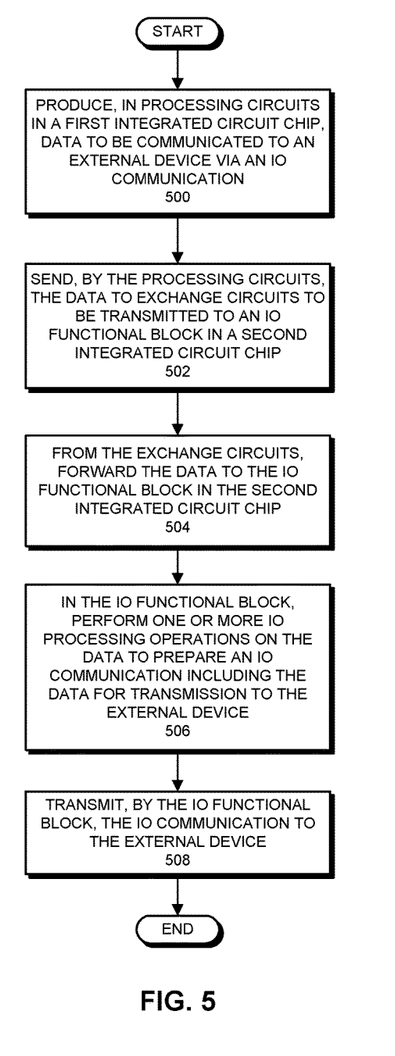
FIG. 5 presents a flowchart illustrating a process for using an IO functional block for performing IO processing operations for transmitting IO communications in accordance with some embodiments.

Performing Input-Output Processing Operations in an Input-Output Functional Block The described embodiments use an IO functional block 108 in a second integrated circuit chip to perform IO processing operations for processing functional block 106 in a first integrated circuit chip. FIG. 5 presents a flowchart illustrating a process for using an IO functional block for performing IO processing operations for transmitting IO communications in accordance with some embodiments. Note that the operations shown in FIG. 5 are presented as a general example of operations performed by some embodiments. The operations performed by other embodiments include different operations and/or operations that are performed in a different order. For the example in FIG. 5, an electronic device having a similar internal arrangement to electronic device 100 is described as performing various operations. In some embodiments, however, a differently-arranged electronic device performs the described operations.

The process shown in FIG. 5 starts when processing circuits, e.g., processing circuits 202, in a first integrated circuit chip, e.g., integrated circuit chip 102, produce data to be communicated to an external device via an IO communication (step 500). During this operation, the data is generated by or otherwise acquired from a hardware or software entity, such as when data is produced for output to a peripheral or a network device. For example, a network stack in an operating system executed by the processing circuits may produce a network layer or data link-layer packet in a network protocol stack for communication to a remote device on a network. As another example, a hardware entity may produce data that is to be communicated to a peripheral device on a PCIe bus.

The processing circuits then send the data to exchange circuits in the first integrated circuit chip, e.g., exchange circuits 204, to be transmitted to an IO functional block, e.g., IO functional block 108, in a second integrated circuit chip (step 502). For this operation, the data produced in step 500 is placed in a buffer or memory element associated with the exchange circuits, is routed via one or more internal signal routes (e.g., wires, guides, etc.) to the exchange circuits, or is otherwise delivered to the exchange circuits. In some embodiments, an indication of the particulars of the IO communication, such as a destination device, a type of IO communication, a quality of service of the IO communication, and/or other particulars are sent to the exchange circuits along with the data, although this is not required.

The exchange circuits then forward the data to the IO functional block in the second integrated circuit chip (step 504). For example, the exchange circuits can forward the data via a dedicated or shared signal route such as signal route 110. As described above, the exchange circuits are generally simpler circuits and thus this operation may be as basic as using transmission driver circuits to forward the data to the IO functional block in the second integrated circuit chip. In some embodiments, however, the data is temporarily buffered, timing is applied, and/or other operations are performed when sending the data to the IO functional block in the second integrated circuit chip. Note, however, that the exchange circuits in some embodiments lack corresponding circuit elements and therefore do not—and possibly cannot—perform the IO processing operations that are performed in the IO functional block.

The IO functional block then performs one or more IO processing operations to prepare an IO communication including the data for transmission to the external device (step 506). The particular IO processing operations performed by the IO functional block on the data depends on the IO communication type of the IO communication. For example, assuming that the IO communication involves communicating the data in a packet data over a corresponding network, the IO functional block can perform some or all operations of lower layer(s) of a network stack such as encoding, error correction, flow control, sequencing, fragmentation, equalization, filtering, modulation, line coding, and/or other operations (perhaps performing some of the IO processing operations as the data/packet is transmitted in step 508).

The IO functional block then transmits the IO communication to the external device (step 508). For this operation, the IO functional block transmits the IO communication via a corresponding interface, such as a PCIe interface or a Gen-Z interface, etc., on a wired or wireless signal route (e.g., a PCIe bus, etc.). For example, a packet, stream of signals, etc. that includes the data can be transmitted on a wired network via one or more IO pins coupled to the IO functional block (note that such IO pins may not be present on the first integrated circuit chip).

Figure 6:
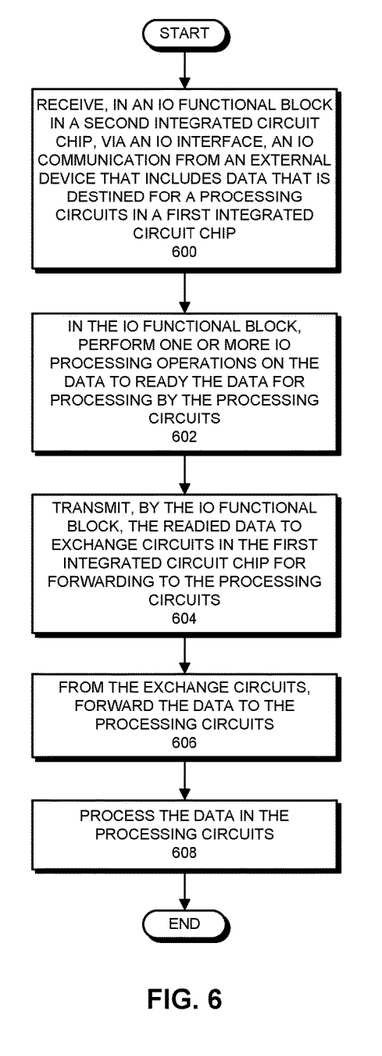
FIG. 6 presents a flowchart illustrating a process for using an IO functional block for performing IO processing operations for receiving IO communications in accordance with some embodiments.

FIG. 6 presents a flowchart illustrating a process for using an IO functional block for performing IO processing operations for receiving IO communications in accordance with some embodiments. Note that the operations shown in FIG. 6 are presented as a general example of operations performed by some embodiments. The operations performed by other embodiments include different operations and/or operations that are performed in a different order. For the example in FIG. 6, an electronic device having a similar internal arrangement to electronic device 100 is described as performing various operations. In some embodiments, however, a differently-arranged electronic device performs the described operations.

The process shown in FIG. 6 starts when an IO functional block in a second integrated circuit chip, e.g., IO functional block 108, receives via an IO interface, an IO communication from an external device that includes data that is destined for a processing functional block in a first integrated circuit chip, e.g., processing functional block 106 (step 600). During this operation, an IO communication is received via a corresponding interface, such as a PCIe interface or a Gen-Z interface, etc., on a wired or wireless signal route (e.g., a PCIe bus, etc.). For example, a packet, stream of signals, etc. that includes the data can be received from a wired network via one or more IO pins coupled to the IO functional block.

The IO functional block then performs one or more IO processing operations to ready the data for processing in the processing circuits (step 602). The particular IO processing operations performed by the IO functional block on the received IO communication depends on type of the IO communication. For example, assuming that the IO communication includes a stream of signals representing a packet that was received via corresponding network, the IO functional block performs some or all operations of a physical layer and a data link layer of a network stack such as decoding, error correction, filtering, flow control, sequencing, demodulation, and/or other operations (perhaps performing some of the IO processing operations as the IO communication is received in step 600).

The IO functional block then transmits the data to exchange circuits, e.g., exchange circuits 204, in the first integrated circuit chip to be forwarded to the processing circuits in the first integrated circuit chip (step 604). For this operation, the data produced in step 602 is routed via one or more dedicated or shared signal routes, e.g., signal route 110, to the exchange circuits. As was described above, the exchange circuits are generally simpler circuits and so transmitting the data to the exchange circuits may involve simply sending the data via the signal route to one or more receivers in the exchange circuits. In some embodiments, however, the data is temporarily buffered, timing is applied, and/or other operations are performed when sending the data to the exchange circuits.

From the exchange circuits, the data is forwarded to the processing circuits (step 606). The processing circuits receive the data, e.g., the data is stored in registers or other memory locations in the processing circuits, and the processing circuits process the data in accordance with the type of IO communication (step 608). For example, an operating system executed by the processing circuits may process the data through layers of a network protocol stack in preparation for delivering the data therein to a software application.

Direct Memory Access for Input-Output Communications

In some embodiments, IO functional block 108 includes a direct memory access (DMA) mechanism that enables IO functional block 108 to store data from IO communications in a local memory on a same integrated circuit chip as the IO functional block 108 (e.g., memory circuits such as those shown in FIG. 3) or return, to requesting external devices, data retrieved from the local memory. In these embodiments, IO functional block 108 avoids the need for forwarding the data to the processing functional block 106 for processing and eventual return to the local memory for storage or for forwarding data requests to the processing functional block 106 for processing therein. For example, when IO functional block 108 is located on a memory chip in a main memory of electronic device 100 and the data would eventually have been stored in the memory, IO functional block 108 stores the data in memory directly. As another example, when IO functional block 108 is located on a memory chip in a main memory of electronic device 100 and the data would eventually have been retrieved from the memory by processing functional block 106, IO functional block 108 retrieves the data directly from the memory and responds to a requesting external device with the data. In some embodiments, for the latter example, the data may be deliberately stored/buffered in the memory by the processing functional block 106 (and perhaps in a designated location in the memory) for this scenario.

Figure 7:
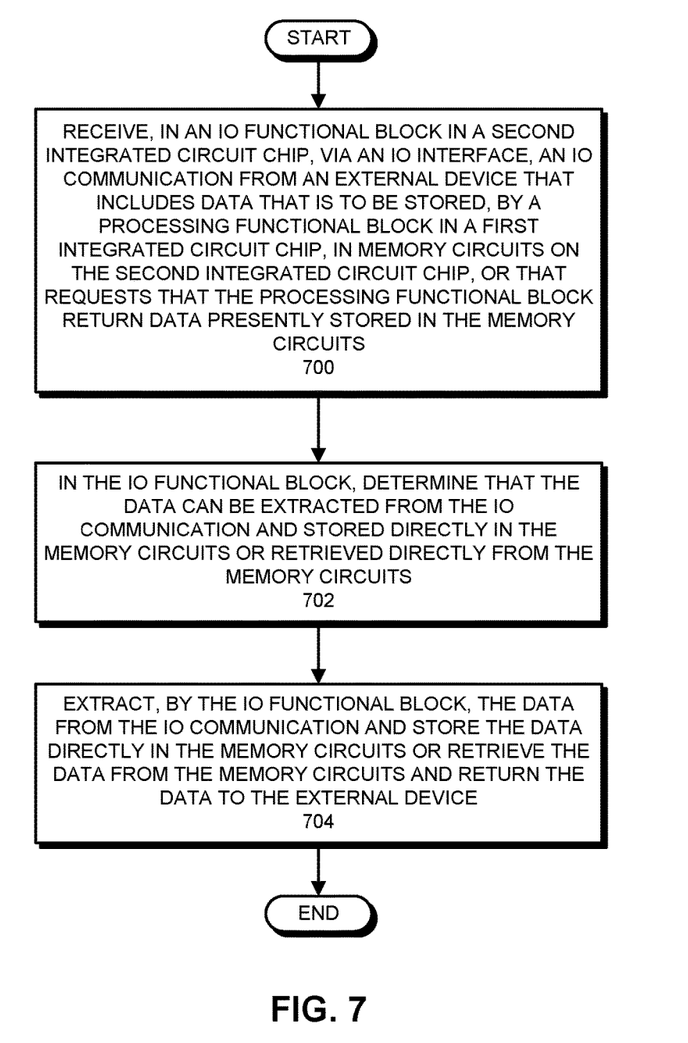
FIG. 7 presents a block diagram illustrating a process for performing a direct memory access operation in an IO functional block in accordance with some embodiments.

FIG. 7 presents a block diagram illustrating a process for performing a direct memory access operation in an IO functional block in accordance with some embodiments. Note that the operations shown in FIG. 7 are presented as a general example of operations performed by some embodiments. The operations performed by other embodiments include different operations and/or operations that are performed in a different order. For the example in FIG. 7, an electronic device having a similar internal arrangement to electronic device 100 is described as performing various operations. In some embodiments, however, a differently-arranged electronic device performs the described operations.

The process shown in FIG. 7 starts when an IO functional block in a second integrated circuit chip, e.g., IO functional block 108, receives via an IO interface, an IO communication from an external device that includes data that is to be stored, by a processing functional block in a first integrated circuit chip, e.g., processing functional block 106, in memory circuits on the second integrated circuit chip, or that requests that the processing functional block return data that is presently stored in the memory circuits (step 700). During this operation, an IO communication is received via a corresponding interface, such as a PCIe interface or a Gen-Z interface, etc., on a wired or wireless signal route (e.g., a PCIe bus, etc.). For example, a packet that includes the data or the request for the data can be received from a wired network via one or more IO pins coupled to the IO functional block.

The IO functional block then determines that the data can be extracted from the IO communication and stored directly in a memory circuits or retrieved directly from the memory circuits (step 702). For example, the IO functional block recognizes the IO communication as a packet in which the data is included, and can be extracted, based on comparing the packet to a template. As another example, in some embodiments, the IO functional block may simply determine that a packet has been received, knowing in advance that data appears in all received packets, in the same location in the packet, etc. As another example, in some embodiments, the IO functional block includes circuit elements that recognize one or more characteristics of data request IO communications (e.g., packet format, length, IO communication source, etc.) and processes the request as described.

The IO functional block 108 then extracts the data from the IO communication and stores the data directly in the memory or retrieves the data from the memory circuits and returns the data to the requesting external device (step 704). For example, for a data storage IO communication, given a known format of the IO communication, the IO functional block decodes, parses, or otherwise processes the IO communication to acquire the data included therein and then stores the data directly in the local memory. By "directly" as used here, it is meant that a processing functional block need not be involved in the storing or retrieving operation, but that the IO functional block 108 can complete the storing or retrieving operation alone. Note, however, that various operations may be performed to inform the processing functional block of the storing of or retrieving of the data, etc.

In some embodiments, measures are taken to avoid the above-described DMA operation corrupting data and/or improperly interfering with data accesses in the memory by other functional blocks and entities in electronic device 100. For example, in some embodiments, memory stores or retrievals (at least of the type described for FIG. 7) are performed "atomically" using corresponding memory storage operations, and are not permitted to be interrupted or interfered with by other memory accesses. For instance, one or more memory locations may be locked or otherwise protected as data is stored to or retrieved from them during a DMA operation.

In some embodiments, a computing device (e.g., electronic device 100, and/or some portion thereof) uses code and/or data stored on a non-transitory computer-readable storage medium to perform some or all of the operations herein described. More specifically, the computing device reads the code and/or data from the computer-readable storage medium and executes the code and/or uses the data when performing the described operations. A computer-readable storage medium can be any device, medium, or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs).

In some embodiments, one or more hardware modules are configured to perform the operations herein described. For example, the hardware modules can include, but are not limited to, one or more processors/cores/central processing units (CPUs), application-specific integrated circuit (ASIC) chips, field-programmable gate arrays (FPGAs), compute units, embedded processors, graphics processors (GPUs)/graphics cores, pipelines, Accelerated Processing Units (APUs), system management units, power controllers, and/or other programmable-logic devices. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., electronic device 100, IO functional block 108, processing functional block 106, and/or some portion thereof) is stored on a non-transitory computer-readable storage medium that includes a database or other data structure which can be read by a computing device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device, comprising:
a first integrated circuit chip including a processing functional block; and
a second integrated circuit chip including an input-output (IO) functional block;
wherein the first integrated circuit chip lacks at least some elements of the IO functional block, so that the processing functional block is unable to perform corresponding IO operations without the IO functional block; and
wherein the IO functional block is configured to:
perform one or more IO processing operations on behalf of the processing functional block, the performing the one or more IO processing operations comprising:
receiving, via an IO interface, an IO communication from an external device, the IO communication including data to be stored in memory circuits by the processing functional block or requesting, from the processing functional block, data that is presently stored in the memory circuits; and
performing a direct memory access operation to directly store the data in or retrieve the data from the memory circuits.

2. The electronic device of claim 1, wherein the first integrated circuit chip lacks one or more of data link layer and physical layer portions of an IO interface for the processing functional block, the one or more of the data link layer and the physical layer portions of the IO interface being located in the IO functional block on the second integrated circuit chip.

3. The electronic device of claim 2, wherein the physical layer portion of the IO interface on the second integrated circuit chip includes one or more IO pins, the IO pins configured to be communicatively coupled to one or more devices external to the first integrated circuit chip and the second integrated circuit chip.

4. The electronic device of claim 1, wherein the second integrated circuit chip further comprises:
a buffer functional block, the buffer functional block configured to buffer information from or based on IO communications destined for the processing functional block in the second integrated circuit chip.

5. The electronic device of claim 1, wherein the first integrated circuit chip including the processing functional block is fabricated using first silicon process feature sizes and the second integrated circuit chip including the input-output (IO) functional block is fabricated using second silicon process feature sizes, the first silicon process feature sizes being smaller than the second silicon process feature sizes.

6. The electronic device of claim 1, wherein the second integrated circuit chip is a memory circuit integrated circuit chip including a plurality of memory circuits.

7. The electronic device of claim 1, wherein the second integrated circuit chip is a memory circuit integrated circuit chip or a logic integrated circuit chip included in a stack of two or more memory circuit integrated circuit chips.

8. The electronic device of claim 1, wherein the first integrated circuit chip and the second integrated circuit chip are stacked and one or more through-silicon vias are communicatively fabricated in at least one of the first integrated circuit chip and the second integrated circuit chip.

9. The electronic device of claim 1,
wherein the second integrated circuit chip further comprises:
one or more communication signal routes coupled between the processing functional block on the first integrated circuit chip and the IO functional block on the second integrated circuit chip; and
a memory circuit functional block that comprises a plurality of memory circuits, wherein the one or more communication signal routes are arranged to carry, along with the IO communications, memory data communications between the memory circuit functional block and the processing functional block, so that IO communications and memory data communications are multiplexed on the one or more communication signal lines; and
wherein the first integrated circuit chip further comprises:
an arbitration functional block that controls which of the memory data communications and IO communications are currently carried on the communication signal lines.

10. A method for handling IO communications in an electronic device that includes a first integrated circuit chip including a processing functional block and a second integrated circuit chip including an input-output (IO) functional block, the method comprising:
using the IO functional block on the second integrated circuit chip to perform one or more IO processing operations on behalf of the processing functional block on the first integrated circuit chip, wherein the first integrated circuit chip lacks at least some elements of the IO functional block, so that the processing functional block is unable to perform corresponding IO operations without the IO functional block, and wherein the performing the one or more IO processing operations comprises;
receiving, in the IO functional block, via an IO communication interface, an IO communication from an external device, the IO communication including data to be stored in memory circuits by processing functional block or requesting, from the processing functional block, data that is presently stored in the memory circuits; and
performing, by the IO functional block, a direct memory access (DMA) operation to directly store the data in or retrieve the data from the memory circuits.

11. The method of claim 10, wherein the first integrated circuit chip lacks one or more of data link layer and physical layer portions of an IO interface for the processing functional block, the one or more of the data link layer and the physical layer portions of the IO interface being located in the IO functional block on the second integrated circuit chip.

12. The method of claim 10, wherein using the IO functional block on the second integrated circuit chip to perform the one or more IO processing operations comprises:
producing, in the processing functional block, data in an intermediate format;

sending, to the IO functional block, the data in the intermediate format;

processing, in the IO functional block, the data in the intermediate format to generate an IO communication; and transmitting the IO communication to a destination external device.

13. The method of claim 12, wherein the data in the intermediate format is a packet produced as an output of an intermediate layer of a network protocol stack, and wherein processing, in the IO functional block, the data in the intermediate format to generate the IO communication comprises:

processing the data in the intermediate format through one or more lower layers of the network protocol stack.

14. The method of claim 10, wherein using the IO functional block on the second integrated circuit chip to perform the one or more IO processing operations comprises:

receiving, in the IO functional block, via an IO communication interface, an IO communication from an external device, the IO communication including data destined for the processing functional block;

processing, in the IO functional block, the IO communication to generate data in an intermediate format;

sending, to the processing functional block, the data in the intermediate format; and processing the data in the intermediate format in the processing functional block.

15. The method of claim 14, wherein the data in the intermediate format is a packet produced as an output of an intermediate layer of a network protocol stack, and wherein processing, in the IO functional block, the IO communication to generate data in the intermediate format comprises:

processing the IO communication through one or more lower layers of the network protocol stack.

16. The method of claim 10, wherein the electronic device further comprises one or more communication signal routes coupled between the processing functional block on the first integrated circuit chip and the IO functional block on the second integrated circuit chip and wherein the second integrated circuit chip further comprises a memory circuit functional block that comprises a plurality of memory circuits, and wherein the method further comprises:

carrying, on the one or more communication signal lines, along with IO communications, memory data communications between the memory circuit functional block and the processing functional block, so that IO communications and memory data communications are multiplexed on the one or more communication signal lines; and arbitrating between the memory data communications and IO communications to dictate which of the memory data communications and IO communications are currently carried on the communication signal lines.

* * * * *